(12) United States Patent
Walker et al.

(10) Patent No.: US 9,981,621 B2
(45) Date of Patent: May 29, 2018

(54) METHOD AND DEVICE FOR IDENTIFYING A POLARITY OF A FREEWHEELING DIODE, ACTUATOR CIRCUIT AND SAFETY DEVICE FOR A VEHICLE

(71) Applicant: Robert Bosch GmbH, Stuttgart (DE)

(72) Inventors: Steffen Walker, Reutlingen (DE); Ruediger Karner, Kornwestheim (DE)

(73) Assignee: ROBERT BOSCH GMBH, Stuttgart (DE)

( * ) Notice: Subject to any disclaimer, the term of this patent is extended or adjusted under 35 U.S.C. 154(b) by 32 days.

(21) Appl. No.: 14/785,785

(22) PCT Filed: May 6, 2014

(86) PCT No.: PCT/EP2014/059158
§ 371 (c)(1),
(2) Date: Oct. 20, 2015

(87) PCT Pub. No.: WO2014/184042
PCT Pub. Date: Nov. 20, 2014

(65) Prior Publication Data
US 2016/0167610 A1    Jun. 16, 2016

(30) Foreign Application Priority Data
May 13, 2013    (DE) .................. 10 2013 208 690

(51) Int. Cl.
*B60R 21/01*    (2006.01)
*G01R 31/28*    (2006.01)
(Continued)

(52) U.S. Cl.
CPC .......... *B60R 21/01* (2013.01); *G01R 31/2632* (2013.01); *G01R 31/2813* (2013.01);
(Continued)

(58) Field of Classification Search
CPC .. B60R 21/01; G01R 31/2632; G01R 31/2813
See application file for complete search history.

(56) References Cited

U.S. PATENT DOCUMENTS 4,779,043 A      10/1988   Williamson
2005/0077884 A1*  4/2005   Krug ..................... H02M 3/156
                                                          323/282
(Continued)

FOREIGN PATENT DOCUMENTS

CN    1221883 A    7/1999
CN    1639705 A    7/2005
(Continued)

*Primary Examiner* — Jermele M Hollington
*Assistant Examiner* — Feba Pothen
(74) *Attorney, Agent, or Firm* — Norton Rose Fulbright US LLP; Gerard Messina

(57) ABSTRACT

A method for identifying a polarity of a freewheeling diode interconnected in parallel to an inductive actuator for a safety unit for a vehicle. The method includes applying a test current to a terminal of the freewheeling diode and carrying out a comparison between a voltage present at the terminal and a threshold voltage while the test current is being applied, a result of the comparison indicating the polarity of the freewheeling diode.

10 Claims, 3 Drawing Sheets

(51) Int. Cl.
  *G01R 31/26* (2014.01)
  *B60R 21/017* (2006.01)
  *B60R 21/00* (2006.01)

(52) U.S. Cl.
  CPC ... *B60R 21/0173* (2013.01); *B60R 2021/0065* (2013.01); *B60R 2021/0088* (2013.01); *B60R 2021/01204* (2013.01)

(56) References Cited

U.S. PATENT DOCUMENTS

2006/0181156 A1* 8/2006 Titschert ............... H02H 9/008
                                                                 307/130
2007/0192030 A1* 8/2007 Tanimichi ............. B60W 10/18
                                                                 701/301
2009/0289579 A1* 11/2009 Zielinski ............... H05B 33/086
                                                                 315/294
2013/0082768 A1* 4/2013 Hirler .................... H01L 29/407
                                                                 327/580
2014/0197846 A1* 7/2014 Yamaguchi ............ H01L 22/34
                                                                 324/606

FOREIGN PATENT DOCUMENTS

| DE | 34 43 967 | 6/1986 |
| DE | 102012201049 A1 | 7/2013 |
| JP | S58133579 A | 8/1983 |
| JP | 2007118934 A | 5/2007 |
| WO | WO 2004/086069 | 10/2004 |
| WO | WO 2013/110523 | 8/2013 |

* cited by examiner

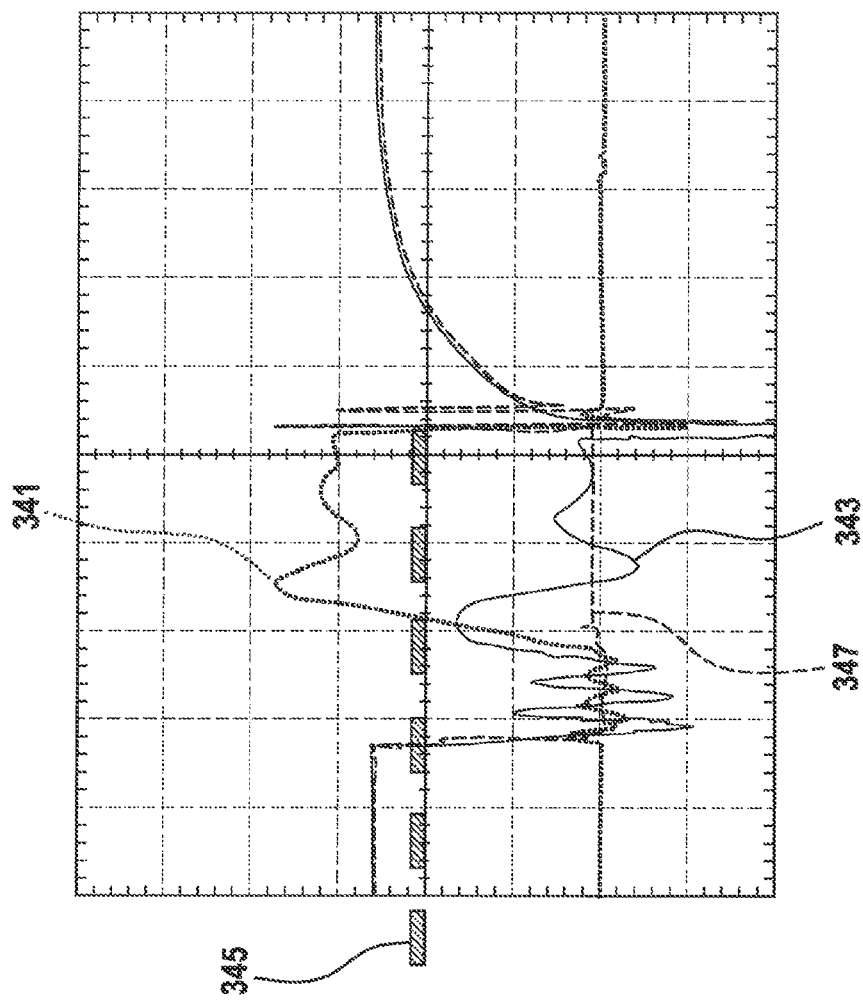

METHOD AND DEVICE FOR IDENTIFYING A POLARITY OF A FREEWHEELING DIODE, ACTUATOR CIRCUIT AND SAFETY DEVICE FOR A VEHICLE

FIELD OF THE INVENTION

The present invention relates to a method and a device for identifying a polarity of a freewheeling diode connected in parallel to an inductive actuator for a safety unit for a vehicle, to an actuator circuit and to a safety device for a vehicle.

BACKGROUND INFORMATION

To trigger a safety device of a vehicle, for example, an airbag, an inductive actuator in the form of an inductive load may be utilized. When switching off activation currents, for example, airbag ignition currents using inductive loads (for example, low-energy actuators, LEA for short), discrete freewheeling diodes are used in order to avoid having to reduce the resultant energy or voltage of the inductance in the output stages of a control unit, for example, in the form of an ASIC. In such a case, installing these freewheeling diodes in which the polarity is reversed must be avoided.

SUMMARY OF THE INVENTION

Against this background, a method and a device are provided with the present invention for identifying a polarity of a freewheeling diode connected in parallel to an inductive actuator for a safety device for a vehicle, an actuator circuit and a safety device for a vehicle as recited in the main claims. Advantageous embodiments result from the respective subclaims and the following description.

A polarity of a freewheeling diode connected in parallel to an inductive actuator may be checked by applying a test current to the freewheeling diode and by evaluating a resultant voltage at the freewheeling diode. The voltage may be advantageously evaluated by a simple threshold value comparison. In addition, the polarity may occur during a start-up or an operation of the inductive actuator, i.e., in the installed state of the inductive actuator.

A method for identifying a polarity of a freewheeling diode connected in parallel to an inductive actuator for a safety device for a vehicle includes the following steps:

applying a test current to one terminal of the freewheeling diode; and carrying out a comparison between a voltage present at the terminal and a threshold voltage, while the test current is applied, a result of the comparison indicating the polarity of the freewheeling diode.

A vehicle may be understood to mean, for example, a passenger vehicle, a truck or a motorcycle.

A safety device may be understood to mean a device of the vehicle, which is configured to protect the occupants, the vehicle or other road users from harm. This includes, for example, a roll bar, an active hood, an active driver seat, a device for tightening a safety belt or an airbag.

An inductive actuator may be understood to mean a device, which is configured to activate, trigger, move or adjust the safety device in response to an activation current flowing through the inductive actuator. The actuator may be configured to generate a magnetic field for activating the safety device in response to the activation current. It may, therefore, be a magnetic actuator. Such a magnetic field then exerts a force on a magnetizable material, which thereupon moves in the magnetic field. The movement, in turn, may result in the unlocking of a holding device, as a result of which a safety device may be triggered. For example, the safety device itself is subject to mechanical tension and the energy stored in the tension is released by the unlocking of the holding device. The actuator may, for example, include an inductance or a coil or may be implemented as an inductance or a coil.

A freewheeling diode in the present case may be understood to mean a diode, which is attached in such a way that in case of a correct polarity of the freewheeling diode, a voltage induced by the inductive actuator across the freewheeling diode may be reduced. In the event of an incorrect polarity of the freewheeling diode, an activation current for triggering the inductive actuator may, instead of flowing through the actuator, flow through the freewheeling diode and thus prevent a triggering of the actuator. It is important, therefore, to be able to test or identify the polarity of the freewheeling diode in the interconnected or installed state.

The test current may be applied to the terminal of the freewheeling diode using a suitable current source or voltage source. If the freewheeling diode and the inductive actuator form an actuator unit, it is then possible to also apply the test current to a terminal of the actuator unit, which is connected to the terminal of the freewheeling diode and to a terminal of the inductive actuator.

To carry out the comparison, the voltage present at the terminal of the freewheeling diode may be detected and compared with the threshold voltage, which may have a predefined value. The threshold voltage may be greater than a diode forward voltage of the freewheeling diode. An appropriate comparing device, for example, a comparator, may be used to carry out the comparison. As a function of the comparison result, a comparison signal may be output which represents the result and indicates the polarity of the freewheeling diode. Alternatively, a comparison value corresponding to the comparison signal may be read out.

According to one exemplary embodiment, a test current is applied in the step of applying with a current intensity, which is less than a current intensity of an activation current for triggering the inductive actuator. In this way, it is possible to identify the polarity of the freewheeling diode, yet avoid a false triggering of the inductive actuator.

The step of applying the test current may be carried out during an initialization phase of a control unit for controlling the inductive actuator. Alternatively or in addition, the step of applying the test current may be carried out during a normal operating mode of the control unit for controlling the inductive actuator. In this way, it is possible to identify a correct polarity or an incorrect polarity, i.e., a reverse polarity via a suitable circuit installed in the vehicle.

A control unit may be understood to mean a unit, which is suitable for controlling an activation of the safety device using the inductive actuator. For example, the control unit may be implemented as an integrated circuit. The control unit may include units which are configured to carry out or activate the steps of the method for identifying the polarity of the freewheeling diode.

In the step of applying, the test current may be applied to the terminal which corresponds to the cathode of the freewheeling diode for the case in which the freewheeling diode is interconnected with correct polarization with respect to the inductive actuator or with respect to an activation device of the inductive actuator. Such an activation device may include, for example, switches for the controlled connection of the inductive actuator and thus of the freewheeling diode, including operating voltage potentials. To activate the actuator, for example, one first terminal of the inductive actuator may be connected to an activation voltage and one second terminal of the inductive actuator may be connected to ground. If the freewheeling diode is correctly installed and, therefore, has the correct polarity, the cathode of the freewheeling diode may then be connected electrically conductively to the first terminal of the inductive actuator. Thus, the freewheeling diode having the correct polarity is switched in the reverse direction with respect to the activation current for activating the inductive actuator.

According to one specific embodiment, the result of the comparison in the step of carrying out may indicate that the freewheeling diode is interconnected with the correct polarity if the voltage present at the terminal is greater than the threshold voltage. In addition or alternatively, the result of the comparison in the step of carrying out may indicate that the freewheeling diode is interconnected with reverse polarity if the voltage present at the terminal is less than the threshold voltage. In this way, it is possible by noting the result to easily identify whether the freewheeling diode is installed with correct polarity or with reverse polarity.

In the step of carrying out, it is possible to carry out at least one additional comparison between the voltage present at the terminal and the threshold voltage, while the test current is being applied. A combination of the results from the comparisons may indicate the polarity of the freewheeling diode. For example, two, three or more comparisons may be carried out and their results evaluated in order to identify the polarity. In this way, it is possible to prevent the polarity from being incorrectly identified due to a false result. To obtain multiple results, it is possible to carry out multiple comparisons in chronological sequence; one comparison signal resulting from a continuous comparison process may be scanned at different points in time, or comparison values arising from a continuous comparison process may be read out at different times. The steps of applying and of carrying out may also be repeated multiple times in order to obtain multiple results. For example, results may be continually generated until a predefined number of successive identical results is achieved.

The method may include a step of receiving a diagnostic signal via an interface to a data bus. The step of applying the test current in this case may be carried out in response to the reception of the diagnostic signal. The data bus may, for example, be a serial data bus as it is used in vehicles. The diagnostic signal may be outputted, for example, from a control unit for controlling the inductive actuator.

A device for testing a polarity of a freewheeling diode connected in parallel to an inductive actuator for a safety device for a vehicle includes the following features:
 a device for applying a test current at a terminal of the freewheeling diode; and
 a device for carrying out a comparison between a voltage present at the terminal and a threshold voltage, while the test current is being applied, a result of the comparison indicating the polarity of the freewheeling diode.

The device for testing the polarity of the freewheeling diode is configured to carry out or implement the steps of the aforementioned method for testing the polarity of the freewheeling diode in appropriate devices. With this embodiment variant of the present invention in the form of a device as well, it is possible to quickly and efficiently achieve the object underlying the present invention.

A device in the present case may be understood to mean an electrical device, which processes signals and, as a function thereof, outputs control signals and/or data signals.

The device may have an interface, which may be configured in hardware and/or in software. In a hardware configuration, the interfaces may, for example, be part of a so-called ASIC system, which contains a wide variety of functions of the device. It is also possible, however, for the interfaces to be dedicated integrated circuits or to be made at least partly of discrete components. In a software configuration, the interfaces may be software modules, which are present on a microcontroller alongside other software modules.

An actuator circuit includes the following features:
 an inductive actuator for activating a safety device;
 a freewheeling diode having one first terminal and one second terminal, the freewheeling diode being interconnected in parallel with the inductive actuator via the first terminal and the second terminal; and
 an aforementioned device for testing a polarity of the freewheeling diode, the device for applying the test current being configured to apply the test current to the first terminal of the freewheeling diode and the device for carrying out the comparison being configured to carry out the comparison between the voltage present at the first terminal and the threshold voltage.

A safety device for a vehicle includes the following features:
 a safety device for protecting an occupant of the vehicle during a collision of the vehicle; and
 an aforementioned actuator circuit, the inductive actuator of the actuator circuit being coupled to the safety device; and
 a control unit for supplying an activation current to the inductive actuator in order to be able to activate the inductive actuator and, therefore, the safety device coupled to the inductive actuator during a collision of the vehicle.

With the inductive actuator, it is possible to activate the safety device, for example, before, during or after a collision has occurred.

Also advantageous is a computer program product having program code, which may be stored on a machine-readable medium, such as a semiconductor memory, a hard disk memory or an optical memory, and which is used for carrying out the method according to one of the previously described specific embodiments, when the program code is executed on a computer or a device. Thus, the steps of the method defined in the program code may be implemented by units of the computer or of the device.

The present invention is described by way of example in greater detail below with reference to the appended drawings.

BRIEF DESCRIPTION OF THE DRAWINGS

FIG. 4 shows a representation of signal curves for a freewheeling diode installed with reverse polarity according to one exemplary embodiment of the present invention.

DETAILED DESCRIPTION

Figure 1:
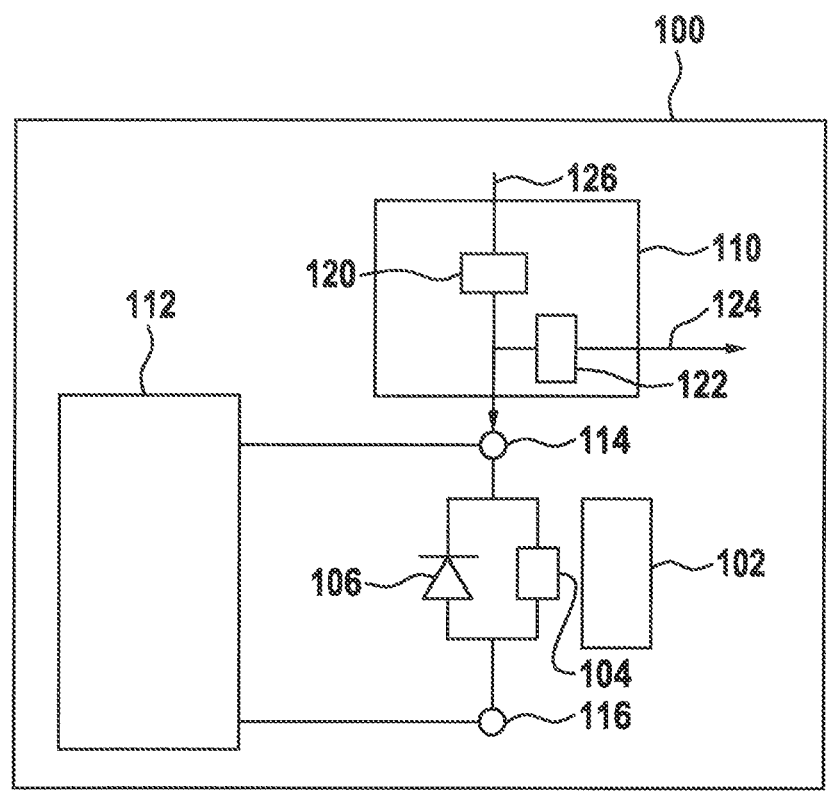
FIG. 1 shows a schematic representation of a safety device for a vehicle according to one exemplary embodiment of the present invention.

In the following description of the exemplary embodiments of the present invention, identical or similar reference numerals are used for elements which are represented in the various figures and act similarly, a repeated description of these elements being omitted.

FIG. 1 shows a schematic representation of a safety device for a vehicle 100 according to one exemplary embodiment of the present invention. The safety device includes a safety unit 102, for example, for protecting a person during a collision of vehicle 100. Safety unit 102 may, for example, include an airbag. In addition, the safety device includes an actuator circuit having an inductive actuator 104 for activating safety unit 102, a freewheeling diode 106 connected in parallel to inductive actuator 104 and a device 110 for testing a polarity of freewheeling diode 106.

The safety device according to this exemplary embodiment also includes a control unit 112, which is configured to supply an activation current to the inductive actuator 104 for activating safety unit 102 using inductive actuator 104. For example, control unit 112 may be configured to connect one first terminal of inductive actuator 104 and, therefore, one first terminal 114 of freewheeling diode 106 to a voltage source via a switch, for example, a so-called high-side switch, and to connect one second terminal of inductive actuator 104 and, therefore, one second terminal 116 of freewheeling diode 106 to a ground terminal via an additional switch, for example, a so-called low-side switch in order to supply the activation current. If freewheeling diode 106 is interconnected with correct polarity, the activation current may then flow through inductive actuator 104. For the activation current, freewheeling diode 106 is connected in the reverse direction.

Device 110 for testing may be integrated into control unit 112 or implemented as a separate circuit. Device 110 for testing is configured to identify whether freewheeling diode 106 is interconnected with correct polarity or with reverse polarity. For this purpose, device 110 for testing includes a unit 120, which is configured to apply a test current to first terminal 114 of freewheeling diode 106. In addition, device 110 for testing includes a unit 122, which is configured to carry out a comparison between a voltage present at first terminal 114 and a threshold voltage, while the test current is being applied to first terminal 114. According to this exemplary embodiment, unit 122 is configured to output a result of the comparison in the form of a comparison signal 124. Comparison signal 124 is configured to indicate whether freewheeling diode 106 is interconnected correctly or incorrectly with respect to its polarity, i.e., whether freewheeling diode 106 is interconnected in the reverse direction or in the forward direction with respect to the activation current. A flow direction of the activation current in this case may correspond to a flow direction of the test current.

Unit 120 may be configured, for example, to supply the test current for a time period of less than 1000 ps, for example, for a time period between 300 ps and 700 ps. The test current may have a value of less than 100 mA, for example, a value between 40 mA and 80 mA.

According to one exemplary embodiment, device 110 includes an interface to a data bus 126. Device 110 is configured to receive a diagnostic signal via the data bus and, in response to the receipt of the diagnostic signal, to feed the test current into first terminal 114.

According to one exemplary embodiment, the described approach for diagnosing freewheeling diode 106 may be employed in ignition circuits having an actuator 104 in the form of an inductive load.

The approach is based on a diagnosis, which identifies freewheeling diodes 106 with reverse polarity. According to one exemplary embodiment, this diagnosis is triggered via a serial bus system 126, for example, an SPI (serial peripheral interface), and then de-energized from a control unit 112, for example, in the form of an ASIC. Unlike what is shown in FIG. 1, the diagnostic signal in this case may be received directly by control unit 112 via bus system 126. Elaborate factory tests with respect to diode reverse polarity may be eliminated if the test, i.e., the diagnosis of freewheeling diode 106, is carried out, for example, in the initializing phase of a control unit of vehicle 100. This results in a considerable savings in test costs. This also results in an increase in safety, since the test may be carried out at each initializing phase and also during normal operation of the control unit. This also ensures a protection of the ASIC output stages, for example, of control unit 112, from destruction, when switching off the ignition current with a freewheeling diode 106 with reverse polarity. For example, the diagnosis in the case of a safety unit 102 in the form of an airbag may be integrated into a previously existing ignition circuit resistance measurement and is therefore area-neutral and time-neutral.

Figure 2:
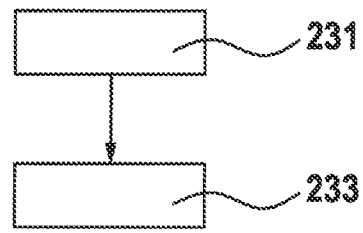
FIG. 2 shows a flow chart of a method for identifying a polarity of a freewheeling diode according to one exemplary embodiment of the present invention.

FIG. 2 shows a flow chart of a method for identifying a polarity of a freewheeling diode according to one exemplary embodiment of the present invention. The freewheeling diode may be the freewheeling diode shown in FIG. 1, which is interconnected in a parallel circuit having an actuator, for example, in the form of an inductance.

In a step 231, a test current is applied to a terminal of the freewheeling diode in order to identify the polarity of the freewheeling diode. The test current may be applied for a specific period of time or until identification of the polarity is concluded.

In a step 233, a voltage at the terminal of the freewheeling diode at which the test current is present is compared to a threshold voltage. A result of the comparison may be outputted and indicate the polarity of the freewheeling diode. The comparison of the voltage with the threshold voltage may be carried out repeatedly. Such a comparison may also be carried out over a period of time, and a comparison result may be read out at multiple, different points in time within the period of time, in order to obtain multiple comparison results. Multiple comparison results may be combined or linked to one another, in order to be able to more reliably identify the polarity of the freewheeling diode.

According to one exemplary embodiment, steps 231, 233 are carried out repeatedly in order to be able to reliably decide, based on multiple comparison results, whether the freewheeling diode is installed with correct polarity or with reversed polarity.

Steps 231, 233 of the method may, for example, be implemented by a device for testing, as is shown in FIG. 1.

If, during the test of the polarity of the freewheeling diode, an activation of the safety unit is necessary, the test current may then be superimposed by an activation current of the inductive actuator.

Figure 3:
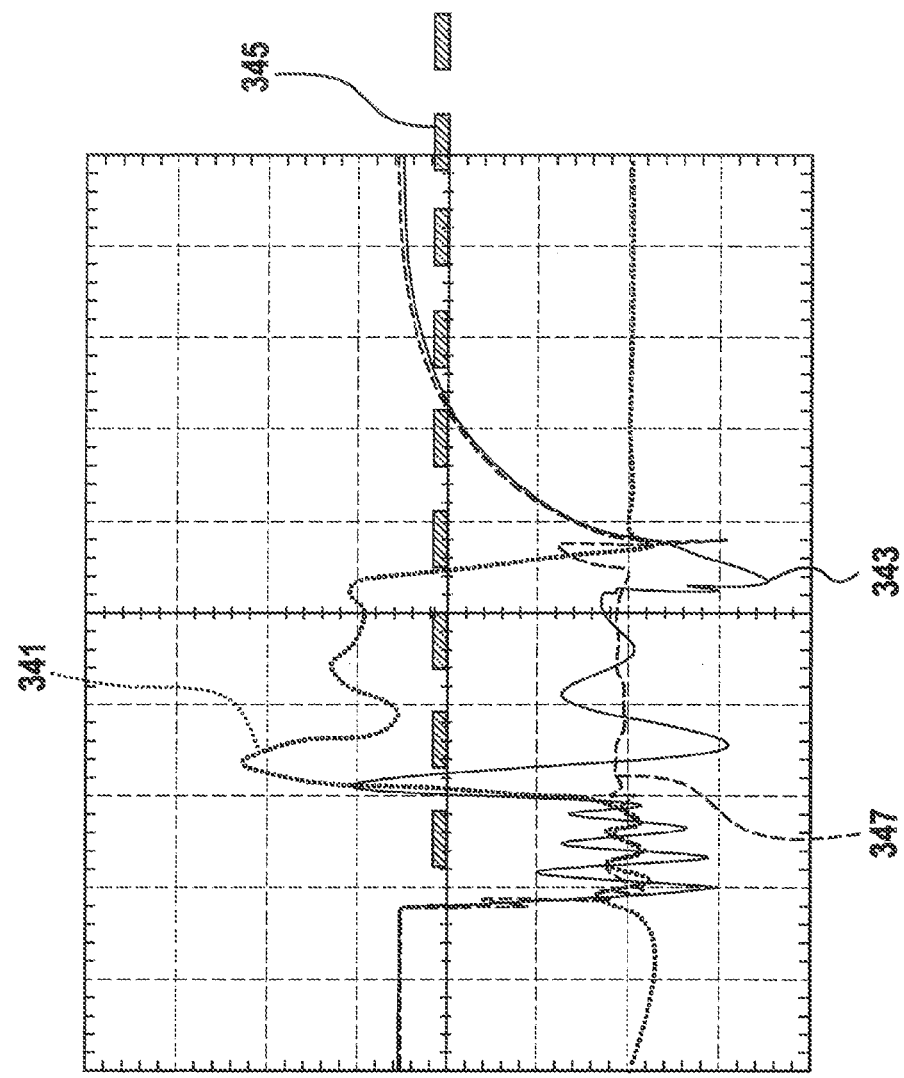
FIG. 3 shows a representation of signal curves for a correctly installed freewheeling diode according to one exemplary embodiment of the present invention.

FIG. 3 shows a representation of signal curves in an actuator circuit in the case of a correctly installed freewheeling diode according to one exemplary embodiment of the present invention. The freewheeling diode in this case may be that shown in FIG. 1. To test the polarity of the freewheeling diode, a test current 341 is fed into the first terminal of the freewheeling diode shown in FIG. 1. Test current 341 flows through the inductive actuator when the freewheeling diode is correctly installed, i.e., blocked for test current 341. As a result, a test voltage 343 builds up at the first terminal, which is compared with a threshold voltage 345 for checking the polarity of the freewheeling diode. Also shown in FIG. 3 is a curve of a voltage 347 at the second terminal of the freewheeling diode.

The curve of test current 341 exhibits a kind of square pulse. As the flank of the test current 341 increases, so too does test voltage 343 and, in the process, it exceeds threshold voltage 345, which is higher than the diode forward voltage. This exceeding is interpreted to mean that the freewheeling diode is correctly installed. In the case of a diode with reverse polarity, test voltage 343 would be reduced by a current flow through the freewheeling diode before reaching threshold voltage 345. Test voltage 343 drops again, in this case, also below threshold voltage 345, before test current 341 has reached its maximum value.

Voltage 347 exhibits no increase during the increase of test current 341.

FIG. 4 shows a representation of signal curves in a freewheeling diode, unlike FIG. 3, installed with reverse polarity, according to one exemplary embodiment of the present invention.

The curve of test current 341 again exhibits a kind of square pulse. As the flank of test current 341 increases, so too does test voltage 343, but drops again before reaching threshold voltage 345, and therefore does not exceed threshold voltage 345. This non-exceeding over the entire time period, during which test current 431 is fed in, is interpreted to mean that the freewheeling diode is installed with reverse polarity. Voltage 347 exhibits no increase during the increase of test current 341, but does exhibit a temporary sudden increase, in this case, beyond threshold voltage 345 as test current 341 drops.

FIGS. 3 and 4 depict significant voltage curves 343, 347 of an ignition circuit resistance measurement in a low-energy ignition circuit, a so-called LEA ignition circuit. One curve represents test current 341 through the ignition circuit. Test current 341 is, for example, 60 mA for 500 ps. Another curve represents voltage 343 on the ignition circuit plus-side, i.e., at the first terminal shown in FIG. 1, and another curve represents voltage 347 on the ignition circuit minus-side, i.e., at the second terminal shown in FIG. 1.

The freewheeling diode in FIG. 3 is correctly installed. In FIG. 4, in contrast, the freewheeling diode is installed with reverse polarity.

In FIG. 3, it is apparent how voltage 343 increases at the plus-side as a function of the current increase of test current 341 (U_L=L*dI/dt). During the test current increase, no current flows through the correctly installed freewheeling diode.

The behavior from FIG. 4 differs by contrast. Here, the polarity of the freewheeling diode is reversed. As test current 341 increases, the diode is energized; voltage 345 on the plus-side does not exceed a diode forward voltage.

The aim of the diagnosis is to differentiate these two cases from one another. This is achieved by the introduction of a voltage threshold 345. For this purpose a comparator circuit is scanned as test current 341 is activated. If this comparator circuit recognizes that threshold 345 is exceeded a certain minimum number of times, for example, exceeded at least three times, then the result is positive, i.e., the freewheeling diode is correctly installed. The comparator circuit may, for example, be part of the device shown in FIG. 1 for carrying out the comparison.

The diagnosis may be advantageously managed with a standard ignition circuit resistance measurement. In other words, it may be evaluated as a function of a resistance present between the first and second terminals shown in FIG. 1 to identify whether the freewheeling diode is installed correctly or with reverse polarity. The resistance measurement may be carried out while the test current is present.

The exemplary embodiments described and shown in the figures are selected merely as examples. Different exemplary embodiments may be combined with one another entirely or with respect to individual features. One exemplary embodiment may also be supplemented by features of another exemplary embodiment. In addition, methods steps according to the present invention may be repeated and carried out in a sequence different from that described. If an exemplary embodiment includes an "and/or" linkage between a first feature and a second feature, this is to be read in the sense that the exemplary embodiment according to one specific embodiment includes both the first feature and the second feature, and according to another specific embodiment, either only the first feature or only the second feature.

What is claimed is:

1. A method for identifying a polarity of a freewheeling diode interconnected in parallel to an inductive actuator for a safety unit for a vehicle, the method comprising:
   applying a test current to one terminal of the freewheeling diode; and
   comparing a voltage present at the terminal and a threshold voltage having a predefined value greater than a diode forward voltage of the freewheeling diode, while the test current is being applied;
   wherein a result of the comparison indicates a polarity of the freewheeling diode.

2. The method of claim 1, wherein in the test current is applied with a current intensity, which is less than a current intensity of an activation current for triggering the inductive actuator.

3. The method of claim 1, wherein the test current is applied during an initializing phase or during a normal operational mode of a control unit for controlling the inductive actuator.

4. The method of claim 1, wherein the test current is applied to the terminal, which corresponds to the cathode of the freewheeling diode for the case in which the freewheeling diode is interconnected with a correct polarity with respect to the actuator.

5. The method of claim 1, wherein in the result of the comparison indicates that the freewheeling diode is interconnected with a correct polarity when the voltage present at the terminal is greater than the threshold voltage, and/or in which in the result of the comparison indicates that the freewheeling diode is interconnected with reverse polarity when the voltage present at the terminal is less than the threshold voltage.

6. The method of claim 1, wherein at least one additional comparison is performed between the voltage present at the terminal and the threshold voltage, while the test current is being applied, and a combination of the results from the comparison indicates the polarity of the freewheeling diode.

7. The method of claim 1, further comprising:
   receiving a diagnostic signal via an interface to a data bus, the test voltage being applied in response to the reception of the diagnostic signal.

8. A device for testing a polarity of a freewheeling diode connected in parallel to an inductive actuator for a safety unit for a vehicle, comprising:
   a test current unit for applying a test current to a terminal of the freewheeling diode; and
   a comparing unit for comparing a voltage present at the terminal and a threshold voltage having a predefined value greater than a diode forward voltage of the freewheeling diode, while the test current is being applied, a result of the comparison indicating the polarity of the freewheeling diode.

9. An actuator circuit, comprising:
an inductive actuator for activating a safety unit;
a freewheeling diode having one first terminal and one second terminal, the freewheeling diode being interconnected in parallel to the inductive actuator via the first terminal and the second terminal; and
a device for testing a polarity of the freewheeling diode, including:
  a test current unit for applying a test current to the first terminal of the freewheeling diode; and
  a comparing unit for comparing a voltage present at the first terminal and a threshold voltage having a predefined value greater than a diode forward voltage of the freewheeling diode, while the test current is being applied, a result of the comparison indicating the polarity of the freewheeling diode.

10. A safety device for a vehicle, comprising:
a safety unit for protecting a person during a collision of the vehicle; and
an actuator circuit, including:
  an inductive actuator for activating the safety unit, the inductive actuator of the actuator circuit being coupled to the safety unit;
  a freewheeling diode having one first terminal and one second terminal, the freewheeling diode being interconnected in parallel to the inductive actuator via the first terminal and the second terminal; and
  a device for testing a polarity of the freewheeling diode, including:
    a test current unit for applying a test current to the first terminal of the freewheeling diode; and
    a comparing unit for comparing a voltage present at the first terminal and a threshold voltage having a predefined value greater than a diode forward voltage of the freewheeling diode, while the test current is being applied, a result of the comparison indicating the polarity of the freewheeling diode; and
a control unit to supply an activation current to the inductive actuator to activate the inductive actuator and the safety unit coupled to the inductive actuator during a collision of the vehicle.

* * * * *